(12) United States Patent
Liu et al.

(10) Patent No.: US 8,952,464 B2
(45) Date of Patent: Feb. 10, 2015

(54) MEMS APPARATUS

(71) Applicant: SenseTech Co., Ltd, Taipei (TW)

(72) Inventors: Mao-Chen Liu, Nantou County (TW); Po-Wei Lu, Bade (TW); Wen-Chieh Chou, Taoyuan County (TW); Shu-Yi Weng, Miaoli County (TW); Chun-Chieh Wang, Taichung (TW)

(73) Assignee: Sensor Tek Co., Ltd., Taipei (TW)

( * ) Notice: Subject to any disclaimer, the term of this patent is extended or adjusted under 35 U.S.C. 154(b) by 0 days.

(21) Appl. No.: 14/200,804

(22) Filed: Mar. 7, 2014

(65) Prior Publication Data

US 2014/0252511 A1 Sep. 11, 2014

(30) Foreign Application Priority Data

Mar. 8, 2013 (TW) .............................. 102108320 A

(51) Int. Cl.
*H01L 27/14* (2006.01)
*B81B 3/00* (2006.01)
(52) U.S. Cl.
CPC ...................................... *B81B 3/0021* (2013.01)
USPC ........................................................ 257/414
(58) Field of Classification Search
CPC .................................................... B81B 3/0021
USPC ........................................................... 257/414
See application file for complete search history.

(56) References Cited

U.S. PATENT DOCUMENTS

| 2013/0277731 | A1* | 10/2013 | Goda et al. ..................... 257/324 |
| 2014/0061849 | A1* | 3/2014 | Tanzawa ....................... 257/499 |
| 2014/0124877 | A1* | 5/2014 | Sun et al. ...................... 257/415 |

FOREIGN PATENT DOCUMENTS

JP 63-269590 * 11/1988 .............. H01S 3/083

* cited by examiner

*Primary Examiner* — William D Coleman
(74) *Attorney, Agent, or Firm* — Muncy, Geissler, Olds & Lowe, P.C.

(57) ABSTRACT

A MEMS apparatus includes a pillar, a supporter, and a solder. The pillar has a first side and a second side opposite to the first side. The supporter supports the pillar. The supporter is adjacent to the pillar, but the supporter is not connected to the pillar. The supporter has a third side and a fourth side opposite to the third side. The supporter includes a plurality of first confined layers and a plurality of second confined layers. These first confined layers and these second confined layers are overlapped with each other. The second side and the third side are adjacent to each other. The solder is located between the second side and the third side. The solder is also located at the first side and the fourth side. The solder is utilized to combine the pillar and the supporter. The solder also isolates the pillar and the supporter.

5 Claims, 2 Drawing Sheets

US 8,952,464 B2

MEMS APPARATUS

CROSS-REFERENCE TO RELATED APPLICATIONS

This non-provisional application claims priority under 35 U.S.C. §119(a) on Patent Application No(s). 102108320 filed in Taiwan, R.O.C. on Mar. 8, 2013, the entire contents of which are hereby incorporated by reference.

TECHNICAL FIELD

The disclosure relates to a micro-electromechanical system (MEMS) apparatus, more particularly to a MEMS apparatus having a higher structural strength, a steady, firm and non-deformed structure.

BACKGROUND

For the semiconductor fabrication of semiconductor devices, metal layers and oxide layers are very commonly used. Most metal layers are formed through a physical deposition whereby these metal layers usually have tensile stress. Most oxide layers are formed through a chemical deposition whereby these oxide layers usually have compressive stress. Take a MEMS apparatus as an example. The residual stress of the MEMS apparatus is an equivalent stress combining the compressive stress with the tensile stress. The MEMS apparatus can integrate an application-specific integrated circuit (ASIC) and a MEMS together in the same surface, thereby simplifying its packaging process.

However, the MEMS structure of the MEMS apparatus will be affected by its residual stress. Take a common XY-axis accelerometer as an example of the MEMS apparatus. The tensile stress of the metal layer will curve the MEMS structure upward, and the compressive stress of the oxide layer will curve the MEMS structure downward. Since the oxide layer is formed with the bonding chemically produced, the oxide layer has a high temperature of deposition and the bond force may cause that the residual stress of the oxide layer is larger than the residual stress of the metal layer. Therefore, the residual stress of the oxide layer leads the MEMS structure to be curved downward. Even if the residual stress can be released through the rapid thermal annealing (RTA) system, the thermal expansion coefficient of composite material will also affect the MEMS structure. For example, the thermal expansion coefficient of aluminum is 23 ppm/° C., and the thermal expansion coefficient of the oxide layer is 0.5 ppm/° C. In this case, the thermal expansion coefficient of aluminum is 46 times the thermal expansion coefficient of the oxide layer. Since the temperature around the MEMS apparatus may change, the design of the MEMS apparatus should consider not only its residual stress but also the thermal expansion related with two different layered materials.

Generally, since MEMS apparatuses nowadays are easily affected by residual stress and temperature and do not have firm structures, these MEMS apparatuses are easily deformed. Moreover, if the structural strength of the MEMS apparatus is not strong enough, the MEMS apparatus may easily be curved due to the change of external force.

SUMMARY

According to one or more embodiments, the disclosure provides a MEMS apparatus. In one embodiment, the MEMS apparatus may include a pillar (or called a beam), a supporter (or called a support beam), and a solder (or called a combination). The pillar may have a first side and a second side opposite to the first side. The supporter may be adjacent to but do not contact with the pillar, have a third side and a fourth side opposite to the third side that is adjacent to the second side, include a plurality of first binding layers (or called first confined layers) and a plurality of second binding layers (or called second confined layers) respectively overlapping the first binding layers, and support the pillar. The solder may be located between the second side and the third side and between the first side and the fourth side, and contact with and separate the pillar and the supporter.

Accordingly, the MEMS apparatus in the disclosure may employ the supporter located beside the pillar to support the pillar, and the supporter may include the first binding layers and the second binding layers respectively overlapping the first binding layers. Moreover, the MEMS apparatus may also employ the solder to connect with the pillar and the supporter and separate the pillar from the supporter. Therefore, the MEMS apparatus may have a firmer structure and a stronger structural strength, thereby not being deformed. Furthermore, the MEMS apparatus may have a better sensitivity and be capable of being applied to more MEMS fields.

BRIEF DESCRIPTION OF THE DRAWINGS

The present disclosure will become more fully understood from the detailed description given herein below for illustration only, and thus does not limit the present disclosure, wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
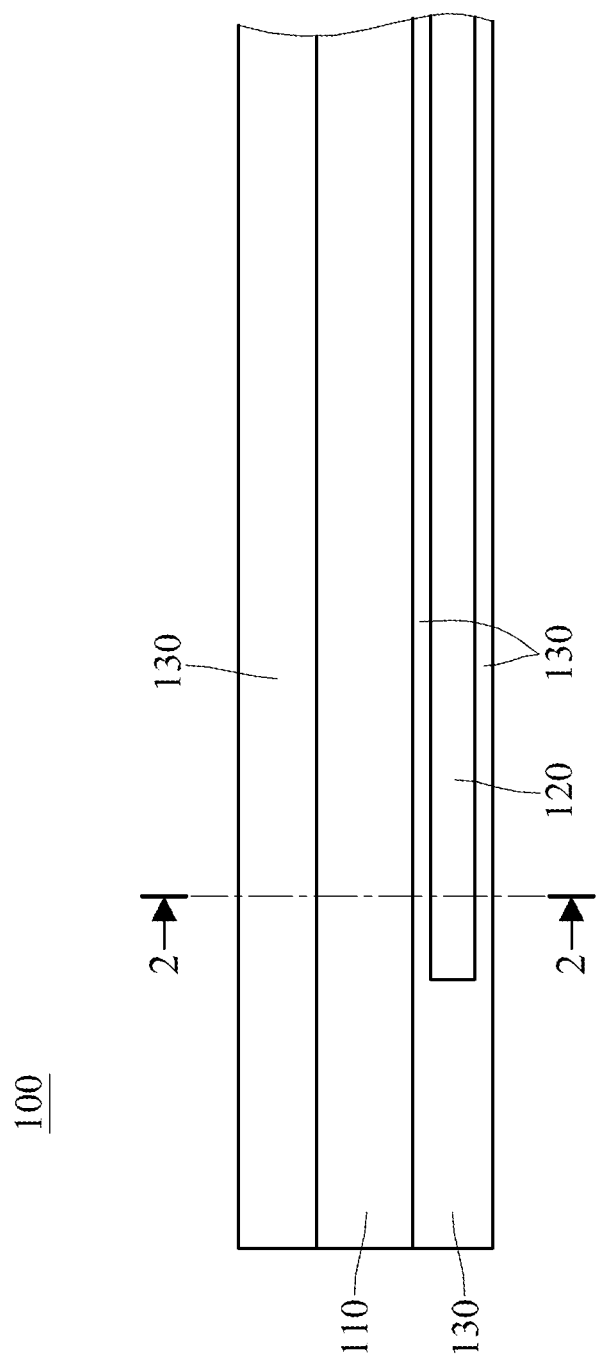
FIG. 1 is a top view of a MEMS apparatus in the disclosure.
Figure 2:
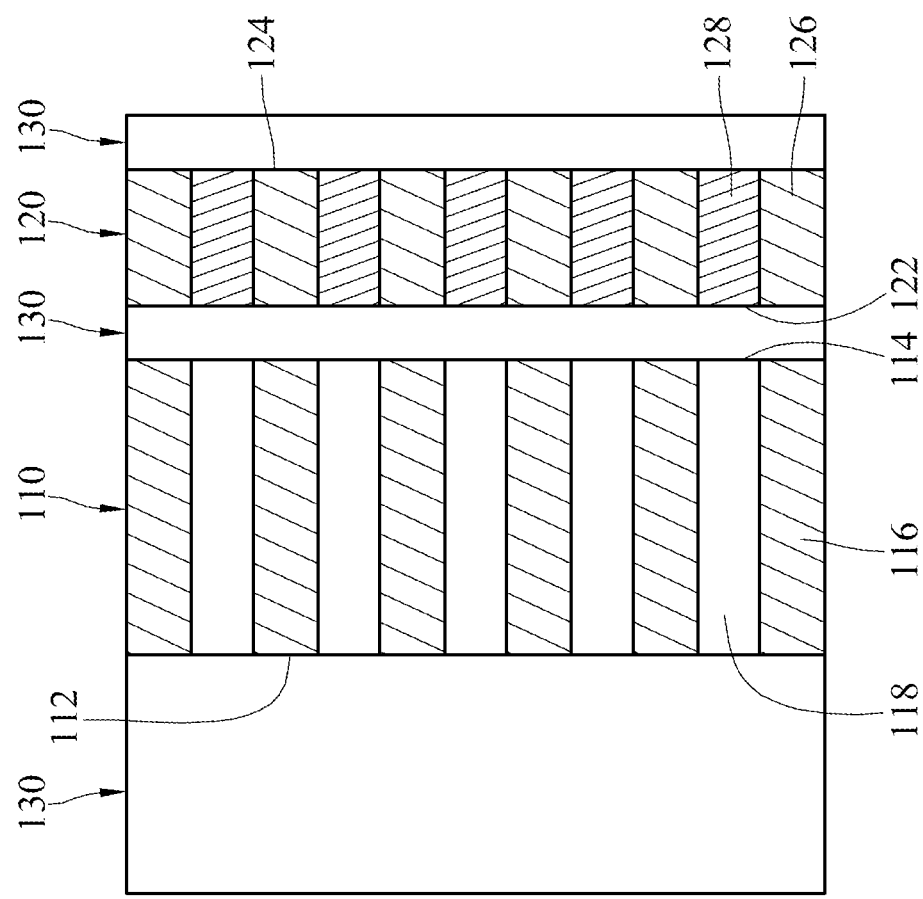
FIG. 2 is a cross-sectional view of the MEMS apparatus in FIG. 1 along the cross-sectional line 2-2.

Referring to FIG. 1 and FIG. 2, a MEMS apparatus 100 is shown. The MEMS apparatus 100 may be applied to an accelerometer, a gyroscope, a flowmeter, an actuator, or a magnetometer. That is, the structure of the MEMS apparatus 100 may be applied to strip beams in the MEMS. The MEMS apparatus 100 may include a pillar 110, a supporter 120, and a solder 130.

The pillar 110 may have a first side 112 and a second side 114, and the first side 112 and the second side 114 are opposite to each other. The pillar 110 may include a plurality of metal layers 116 and a plurality of oxide layers 118, and the metal layers 116 respectively overlap the oxide layers 118. For example, the pillar 110 may be a fork-shaped electrode, a spring beam, or other possible strip beam, but the disclosure will not be limited thereto.

Specifically, the metal layers 116 and the oxide layers 118 may be formed through the thin film deposition, whereby the metal layers 116 and the oxide layers 118 may respectively be layered layer by layer to form the pillar 110. For example, the thin film deposition may be physical vapor deposition (PVD), chemical vapor deposition (CVD), or other possible deposition, but the disclosure will not be limited thereto.

The supporter 120 may support the pillar 110, and may be adjacent to the supporter 120 but not contact with the pillar 110. The supporter 120 may have a third side 122 and a fourth side 124 which is opposite to the third side 122, and the second side 114 of the pillar 110 may be adjacent to the third side 122 of the supporter 120. The supporter 120 may include a plurality of first binding layers 126 and a plurality of second binding layers 128, and the first binding layers 126 may respectively overlap the second binding layers 128. For example, the first binding layer 126 may be metallic or metalloid, and the second binding layer 128 may be made of tungsten or other material with a high hardness, but the disclosure will not be limited thereto.

Specifically, the first binding layers 126 and the second binding layers 128 may be formed through the thin film deposition, so that the first binding layers 126 and the second binding layers 128 may respectively be layered layer by layer to form the supporter 120. For example, the thin film deposition may be PVD or other possible deposition, but the disclosure will not be limited thereto.

The solder 130 may be located between the second side 114 and the third side 122 and between the first side 112 and the fourth side 124, and may connect with the pillar 110 and the supporter 120 and separate the pillar 110 from the supporter 120, so that the pillar 110 and the supporter 120 may not contact with each other and be electrically affected by each other. The second side 114 may be adjacent to the third side 122. For example, the solder 130 may be made of or contain oxide or other possible material with a small thermal expansion coefficient, but the disclosure will not be limited thereto.

In one embodiment, the MEMS apparatus 100 may be capable of bearing or absorbing a plurality of horizontal or vertical components (force) along different directions, so that the horizontal or vertical components may be balanced. Furthermore, the supporter 120 formed with the first binding layers 126 and the second binding layers 128 may fix the MEMS apparatus 100 and enhance the structural strength of the MEMS apparatus 100. In other words, the MEMS apparatus 100 may support the stable horizontal or vertical movement on its surface, thereby preventing the MEMS apparatus 100 from the deformation caused by the horizontal or vertical components.

As set forth above, the MEMS apparatus in the disclosure has the supporter located beside the pillar, supporting the pillar, and including the first binding layers and the second binding layers respectively overlapping the first binding layers, and employs the solder to connect with the pillar and the supporter and separate the pillar from the supporter, thereby steadying the structure of the MEMS apparatus and enhancing the structural strength of the MEMS apparatus. In other words, the MEMS apparatus may have a stable and firm structure and not be deformed. Therefore, the MEMS apparatus may have a better sensitivity and then be applied to more MEMS fields.

What is claimed is:

1. A micro-electromechanical system (MEMS) apparatus, comprising:
   a pillar, having a first side and a second side opposite to the first side;
   a supporter, having a third side and a fourth side opposite to the third side adjacent to the second side, comprising a plurality of first binding layers and a plurality of second binding layers respectively overlapping the first binding layers, and configured to support the pillar which is adjacent to but does not connect to the supporter; and
   a solder, located between the second side and the third side and between the first side and the fourth side, and configured to contact with and separate the pillar and the supporter.

2. The MEMS apparatus according to claim 1, wherein the pillar comprises a plurality of metal layers and a plurality of oxide layers respectively overlapping the plurality of metal layers.

3. The MEMS apparatus according to claim 1, wherein the plurality of first binding layers is metallic, and the plurality of second binding layers is made of tungsten.

4. The MEMS apparatus according to claim 1, wherein the solder is oxide.

5. The MEMS apparatus according to claim 2, wherein the pillar is a fork-shaped electrode or a spring beam.

* * * * *